(12) United States Patent
Kawajiri et al.

(10) Patent No.: US 12,245,378 B2
(45) Date of Patent: Mar. 4, 2025

(54) THREE-DIMENSIONAL MOLDING MACHINE

(71) Applicant: FUJI CORPORATION, Chiryu (JP)

(72) Inventors: Akihiro Kawajiri, Chiryu (JP); Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 398 days.

(21) Appl. No.: 17/626,430

(22) PCT Filed: Nov. 13, 2019

(86) PCT No.: PCT/JP2019/044592
§ 371 (c)(1),
(2) Date: Jan. 11, 2022

(87) PCT Pub. No.: WO2021/009940
PCT Pub. Date: Jan. 21, 2021

(65) Prior Publication Data
US 2022/0264777 A1    Aug. 18, 2022

(30) Foreign Application Priority Data
Jul. 16, 2019 (WO) .................. PCT/JP2019/027961

(51) Int. Cl.
*H05K 13/00*     (2006.01)
*B29C 64/112*    (2017.01)
(Continued)

(52) U.S. Cl.
CPC ........ *H05K 13/0061* (2013.01); *B29C 64/112* (2017.08); *B29C 64/236* (2017.08);
(Continued)

(58) Field of Classification Search
CPC ................ B29C 64/112; B29C 64/236; B29C 64/245; B29C 64/30; B29L 2031/3425;
(Continued)

(56) References Cited

U.S. PATENT DOCUMENTS 6,572,702 B1    6/2003   Freeman et al.
8,833,634 B2 *  9/2014   Nagao ................ H05K 13/0857
                                                        228/9

(Continued)

FOREIGN PATENT DOCUMENTS

DE    10 2016 221 821 A1    5/2018
JP       2005-322702 A      11/2005
(Continued)

OTHER PUBLICATIONS

International Search Report mailed on Jan. 28, 2020 in PCT/JP2019/044592 filed on Nov. 13, 2019, 3 pages.

*Primary Examiner* — Minh N Trinh
(74) *Attorney, Agent, or Firm* — Oblon, McClelland, Maier & Neustadt, L.L.P.

(57) ABSTRACT

A three-dimensional molding machine for manufacturing a three-dimensional molded object comprising an electronic circuit includes multiple modules disposed adjacent to each other, a work unit provided in each of the multiple modules and configured to share a manufacturing operation for manufacturing the three-dimensional molded object on a pallet, and a pallet conveyance section provided in each of the multiple modules and configured to convey the pallet into and out of a module and to transfer the pallet between the module and another adjacent module of the multiple modules.

9 Claims, 6 Drawing Sheets

(51) Int. Cl.
   *B29C 64/236* (2017.01)
   *B29C 64/245* (2017.01)
   *B33Y 10/00* (2015.01)
   *H05K 3/10* (2006.01)
   *H05K 3/12* (2006.01)
   *H05K 13/04* (2006.01)
   *B29L 31/34* (2006.01)
   *B33Y 30/00* (2015.01)
   *B33Y 40/00* (2020.01)

(52) U.S. Cl.
   CPC .............. *B29C 64/245* (2017.08); *H05K 3/10* (2013.01); *H05K 3/125* (2013.01); *H05K 13/0417* (2013.01); *H05K 13/0452* (2013.01); *H05K 13/0469* (2013.01); *B29L 2031/3425* (2013.01); *B33Y 10/00* (2014.12); *B33Y 30/00* (2014.12); *B33Y 40/00* (2014.12)

(58) Field of Classification Search
   CPC ......... B33Y 10/00; B33Y 30/00; B33Y 40/00; H05K 1/0284; H05K 1/092; H05K 1/183
   See application file for complete search history.

(56) References Cited

U.S. PATENT DOCUMENTS

| | | | |
|---|---|---|---|
| 10,959,360 B2* | 3/2021 | Kondo | ............... H05K 13/08 |
| 2017/0042034 A1 | 2/2017 | Maccurdy et al. | |
| 2017/0280567 A1 | 9/2017 | Suzuki et al. | |
| 2022/0264777 A1* | 8/2022 | Kawajiri | ............... B29C 64/112 |

FOREIGN PATENT DOCUMENTS

| | | |
|---|---|---|
| JP | 2006-66811 A | 3/2006 |
| JP | 2010-147267 A | 7/2010 |
| JP | 2017-101933 A | 6/2017 |
| JP | 2017-130553 A | 7/2017 |
| JP | 6403785 B2 | 10/2018 |
| JP | 2019-110254 A | 7/2019 |
| WO | WO 2015/068234 A1 | 5/2015 |
| WO | WO 2016/042657 A1 | 3/2016 |

* cited by examiner

THREE-DIMENSIONAL MOLDING MACHINE

TECHNICAL FIELD

The present description relates to a three-dimensional molding machine for manufacturing a three-dimensional molded object including an electronic circuit.

BACKGROUND ART

Techniques for manufacturing a board product by mounting electronic components to a board on which a circuit pattern of an electronic circuit is formed have become widespread. In recent years, there have been developed three-dimensional molding machines which are configured to form an electronic circuit, which is not a board in form, directly on a three-dimensional molded object. The three-dimensional molding machine performs a molding operation for molding a three-dimensional molded object, a forming operation for forming a circuit pattern, and a mounting operation for mounting an electronic component onto the circuit pattern. One technical example relating to this type of three-dimensional molding machine is disclosed in Patent Literature 1.

A manufacturing apparatus (three-dimensional molding machine) of Patent Literature 1 includes a stage (pallet) on which a three-dimensional molded object is placed, a driving device for moving the stage, a molding unit for forming individual layers of a three-dimensional molded object and molding at least one of an insulating layer and a circuit pattern which are included in those individual layers, a mounting unit for mounting an electronic component on the circuit pattern, and a control section for controlling the movement of the stage in accordance with the operation steps of the molding unit and the mounting unit. According to this manufacturing apparatus, since the molding and mounting operation steps are performed on the stage, the workpiece on the stage does not have to be removed and aligned in position for each step, whereby the time required for shifting the operation steps is shortened.

PATENT LITERATURE

Patent Literature 1: Japanese Patent No. 6403785

BRIEF SUMMARY

Technical Problem

In the three-dimensional molding machine disclosed in Patent Literature 1, since the pallet needs to be moved freely between the multiple units, the driving device is enlarged in size. In addition, in order to suppress the influence of heat dissipated, air blown, an ultraviolet ray emitted in the operating unit, the separation distance between the units is increased, or a shielding mechanism is provided between the units. As a result, the entire three-dimensional molding machine constitutes a large-scale facility, and further, a large installation space is required. Additionally, a great deal of effort is also required for working on transportation and installation of the three-dimensional molding machine, as a result of which workers involved may have difficulty in such work.

An object of the present description is to provide a three-dimensional molding machine which is downsized more than the conventional one by improving the configuration associated with the movement of a pallet.

Solution to Problem

The present description discloses a three-dimensional molding machine for manufacturing a three-dimensional molded object including an electronic circuit, the three-dimensional molding machine including multiple modules disposed adjacent to each other, a work unit provided in each of the multiple modules and configured to share a manufacturing operation for manufacturing the three-dimensional molded object on a pallet, and a pallet conveyance section provided in each of the multiple modules, the pallet conveyance section being configured to convey the pallet into and out of a module of the multiple modules and to transfer the pallet between the module and another adjacent module of the multiple modules.

Advantageous Effects

According to the three-dimensional molding machine disclosed in the present description, the multiple pallet conveyance sections provided individually in the multiple modules perform the conveyance operation of the pallet while sharing the operation. As a result, the multiple pallet conveyance sections can be downsized more than the driving device of the conventional three-dimensional molding machine which is configured to move the pallet freely over almost the whole area of the conventional three-dimensional molding machine. Thus, the downsizing of the three-dimensional molding machine can be realized.

DESCRIPTION OF EMBODIMENTS

Figure 1:
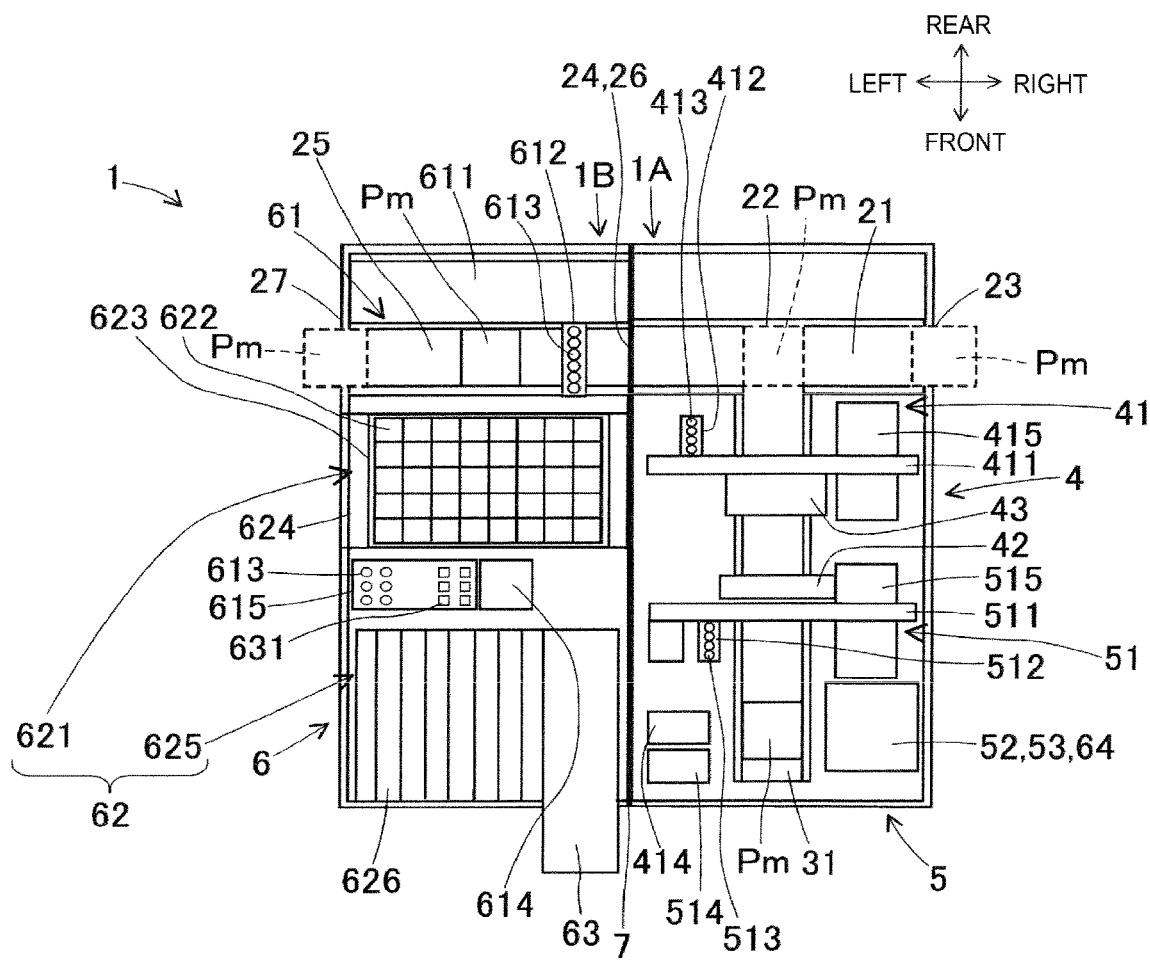
FIG. 1 is a plan view showing a configuration of a three-dimensional molding machine according to a first embodiment.

1. Overall Configuration of Three-Dimensional Molding Machine 1 According to First Embodiment Firstly, an overall configuration of three-dimensional molding machine 1 according to a first embodiment will be described by reference to FIG. 1. Front, rear, left, and right of three-dimensional molding machine 1 are determined as indicated by arrows shown in a top right-hand side corner of FIG. 1 as a matter of convenience. Three-dimensional molding machine 1 manufactures a three-dimensional molded object having an electronic circuit. The shape of a three-dimensional molded object is specified by three-dimensional shape data. The three-dimensional shape data includes multiple pieces of two-dimensional layer data that specify the shape with a pitch of a predetermined microscopic height dimension.

Three-dimensional molding machine 1 includes multiple modules, a work unit provided in each of the multiple modules, a pallet conveyance section provided in each of the multiple modules, and a shielding member 7. Specifically, molding module 1A, which is disposed on a right-hand side, and mounting module 1B, which is disposed on a left-hand side, correspond to the multiple modules. The multiple work units share a manufacturing operation for manufacturing a three-dimensional modeled object on pallet Pm. The multiple pallet conveyance sections can each convey pallet Pm into and out of the module where the pallet conveyance section is provided and transfer pallet Pm between the relevant module and another adjacent module of the multiple modules. The three-dimensional molded object, which is being manufactured, is conveyed while being placed on pallet Pm.

Molding module 1A includes first pallet conveyance section 21, inside conveyance unit 31, molding work unit group 4 configured to share a molding operation for molding a three-dimensional molded object, and forming work unit group 5 configured to share a forming operation for forming a circuit pattern of an electronic circuit. Mounting module 1B includes second pallet conveyance section 25 and mounting work unit group 6 configured to share a mounting operation for mounting an electronic component on the circuit pattern.

Shielding member 7 is disposed between molding module 1A and mounting module 1B. Shielding member 7 is disposed between the two adjacent modules to restrict the work units in one of the two modules from influencing the other of the two modules. Specifically, shielding member 7 restricts at least one of heat dissipated, air blown, and an ultraviolet ray emitted by a work unit in one of the modules from influencing the other of the modules. A material having a superior heat insulating performance and a superior ultraviolet ray cutting-off performance is used for shielding member 7, and resulting shielding member 7 is formed into a plate-like shape, for example. Shielding member 7, which is formed into the plate-like shape, can suppress the influence of air blown irrespective of a material from which shielding member 7 is formed.

2. Inside Configuration of Molding Module 1A

The inside configuration of molding module 1A will be described in detail. First pallet conveyance section 21 is disposed closer to a rear portion inside molding module 1A while extending in a left-right direction. First pallet conveyance section 21 has convey-in end 23, which is opened to the right of molding module 1A, and convey-out end 24, which is opened towards mounting module 1B. In addition, first pallet conveyance section 21 has branching portion 22 disposed between convey-in end 23 and convey-out end 24.

First pallet conveyance section 21 conveys pallet Pm into the module from convey-in end 23 and conveys pallet Pm to branching portion 22. Further, first pallet conveyance section 21 conveys pallet Pm from branching portion 22 to convey-out end 24 to thereby convey pallet Pm out of the module. A hole is bored in an area of shielding member 7 which corresponds to convey-out end 24, as a result of which pallet Pm can be conveyed out of the module without any problem. First pallet conveyance section 21 can reversely also convey pallet Pm from convey-out end 24 to branching portion 22.

Inside conveyance unit 31 is a work unit for sharing a conveyance operation for conveying pallet Pm. Inside conveyance unit 31 extends forwards from branching portion 22 and passes through substantially a center of molding module 1A in the left-right direction. Inside conveyance unit 31 is shared by molding work unit group 4 and forming work unit group 5 and conveys pallet Pm in a front-rear direction. Inside conveyance unit 31 has a pallet transfer mechanism (not shown in drawings), which is disposed near to branching portion 22. The pallet transfer mechanism transfers pallet Pm between first pallet conveyance section 21 and inside conveyance unit 31.

In FIG. 1, pallets Pm are shown by dashed lines at convey-in end 23 and branching portion 22, and pallet Pm is shown by solid lines in the vicinity of a front end of inside conveyance unit 31. First pallet conveyance section 21 and inside conveyance unit 31 are each made up of a conveyor device having a conveyor belt which revolves. First pallet conveyance section 21 and inside conveyance unit 31 may be made up of any other structure than the conveyor device, and hence may be configured to hold and move pallet Pm using a robot hand, for example.

Molding work unit group 4 is disposed at a rear portion of molding module 1A. Molding work unit group 4 performs a molding operation for molding a three-dimensional molded object using molding ink which sets as a result of being irradiated with an ultraviolet ray. Molding work unit group 4 includes molding ink application unit 41, planarizing unit 42, and curing unit 43. Molding ink application unit 41 includes gantry 411, molding head 412, molding nozzles 413, ink tank 414, and maintenance section 415.

Gantry 411 is a portal structure that straddles inside conveyance unit 31. A horizontal section, which extends in the left-right direction, of the gantry 411 is disposed above inside conveyance unit 31 at a height exceeding a height dimension of a three-dimensional molded object. Molding head 412 is mounted on the horizontal section of gantry 411 such that molding head 412 can move in the left-right direction. Multiple molding nozzles 413 are provided on a lower side of molding head 412 such that multiple molding nozzles 413 are aligned in a row in the front-rear direction. Multiple molding nozzles 413 each have a function of switching individually the injection of a molding ink between start and stop thereof. The molding ink is stored in ink tank 414 disposed at a front leftward portion of molding module 1A and is supplied to molding nozzles 413 using a tube (not shown in drawings).

Pallet Pm is conveyed into a work position below gantry 411 before molding head 412 and molding nozzles 413 start to operate. In association with a movement of molding head 412 in the left-right direction, molding nozzles 413 each perform a molding operation for switching individually the injection of the molding ink between start and stop thereof. As a result, a layer shape of the molding ink is formed on pallet Pm. The layer shape matches a shape of a three-dimensional molded object which is specified in layer data.

In the case where a molding width dimension which can be attained by multiple molding nozzles 413 is not good enough to match the size of a three-dimensional molded object to be molded, the molding operation is performed multiple times. To describe this in detail, inside conveyance unit 31 operates to change the position of pallet Pm in the front-rear direction after a first molding operation is performed. Next, a second molding operation is performed to mold an area of the three-dimensional molded object being molded which has not been molded by the first molding operation. In this manner, an overall layer shape of the three-dimensional molded object is molded by repeating the molding operation and the change of the position of pallet Pm.

Pallet Pm whose layer shape has been molded is conveyed to a work position below planarizing unit 42 by inside conveyance unit 31. Alternatively, a molding operation may be performed in which pallet Pm is moved in the front-rear direction by being conveyed by inside conveyance unit 31 with molding head 412 and molding nozzles 413 fixed in place above inside conveyance unit 31.

Maintenance section 415 is provided in a position on a right-hand side of inside conveyance unit 31 and below gantry 411. Molding head 412 and molding nozzles 413 are moved to maintenance section 415 for maintenance from maintenance section 415 as required. Maintenance details given from maintenance section 415 include, for example, cleaning of molding nozzles 413 by wiping tips thereof, exchanging failed molding nozzle 413, and the like.

Planarizing unit 42 is provided in a position spaced forwards away from gantry 411 such that planarizing unit 42 can be lifted up and lowered. Planarizing unit 42 is lowered to the height of the layer shape on pallet Pm which is conveyed in to planarize a surface of the layer shape which is in a liquid state. As a result, the height of the layer shape is made uniform and adjusted to a predetermined microscopic height dimension. Thereafter, pallet Pm is conveyed to a work position below curing unit 43 by inside conveyance unit 31.

Curing unit 43 is provided in a position in front of gantry 411 in such a manner as to be lifted up and lowered. Curing unit 43 is lowered until it comes nearer to the layer shape on pallet Pm, which is conveyed in, and irradiates the layer shape with ultraviolet radiation. As a result, a polymerizable compound in the molding ink polymerizes and solidifies, whereby the layer shape sets. The influence of the ultraviolet radiation emitted by curing unit 43 is controlled by shielding member 7, whereby mounting module 1B is scarcely influenced. As a result, an area requiring countermeasures against ultraviolet radiation so emitted is limited to an inside of molding module 1A, whereby not only an increase in cost is suppressed, but also the reliability in operation of three-dimensional molding machine 1 is improved.

Molding head 412 and molding nozzles 413, planarizing unit 42, and curing unit 43 can operate sequentially and repeatedly. In molding operations from a second one on, a layer shape in a liquid state is formed on an upper side of the solidified layer shape in such a manner as to be superposed thereon, and is then solidified. As a result, the height of the three-dimensional molded object, which is being molded, is increased in increments of the microscopic height dimension. Thereafter, pallet Pm is conveyed to a position where pallet Pm is ready for treatments in the subsequent step.

Forming work unit group 5 is disposed at a front portion inside molding module 1A. Forming work unit group 5 draws and forms a circuit pattern on the three-dimensional molded object using a conductive ink in which metallic fine particles such as silver are mixed in a solvent. Forming work unit group 5 includes circuit ink application unit 51, drying unit 52, and firing unit 53. Circuit ink application unit 51 includes gantry 511, drawing head 512, inkjet nozzles 513, cleaning liquid tank 514, and maintenance section 515.

Gantry 511 is a portal structure that straddles inside conveyance unit 31. A horizontal portion, which extends in the left-right direction, of gantry 511 is disposed above inside conveyance unit 31 at a height exceeding the height dimension of a three-dimensional molded object. Drawing head 512 is mounted on the horizontal portion of gantry 511 such that drawing head 512 can move in the left-right direction. Multiple inkjet nozzles 513 are provided on a lower side of drawing head 512 such that multiple inkjet nozzles 513 are aligned in a row in the front-rear direction. Multiple inkjet nozzles 513 each have a function of switching individually the injection of the conductive ink between start and stop thereof.

Drawing head 512 and inkjet nozzle 513 move to maintenance section 515 before a drawing operation is started. Maintenance section 515 is provided in a position on the right-hand side of inside conveyance unit 31 and below gantry 511. In maintenance section 515, the operator performs a provision operation for providing the conductive ink to inkjet nozzles 513.

Here, since the conductive ink has a relatively short usability period, there may be a case in which the conductive ink is discarded. In that case, the cleaning liquid reserved in cleaning liquid tank 514 disposed in front of ink tank 414 is supplied to inkjet nozzles 513 using a tube (not shown in drawings). As a result, insides of inkjet nozzles 513 are cleaned. Further, inkjet nozzles 513 are kept filled with the cleaning liquid, whereby the cleaning state in inkjet nozzles 513 is maintained until a subsequent provision operation is performed.

Additionally, prior to the start of a drawing operation, pallet Pm on which the three-dimensional molded object, which is being molded or has been molded, is placed is conveyed to a work position below gantry 511. In association with the movement of drawing head 512 in the left-right direction, inkjet nozzles 513 each perform a drawing operation for switching individually the injection of the conductive ink between start and stop thereof. As a result, a shape of a circuit pattern specified by layer data is drawn.

In the case where a drawing width dimension which can be attained by multiple inkjet nozzles 513 is not good enough to match the size of the circuit pattern to be drawn, the drawing operation is performed multiple times. To describe this in detail, inside conveyance unit 31 operates to change the position of pallet Pm in the front-rear direction after a first drawing operation is performed. Next, a second drawing operation is performed to draw an area of a circuit pattern being drawn which has not been drawn by the first drawing operation. In this manner, an overall shape of the circuit pattern is drawn by repeating the drawing operation and the change of the position of pallet Pm. Alternatively, a drawing operation may be performed in which pallet Pm is moved in the front-rear direction by being conveyed by inside conveyance unit 31 with drawing head 512 and inkjet nozzles 513 fixed in place above inside conveyance unit 31.

Firing unit 53 is disposed in a position on the right-hand side of inside conveyance unit 31 and ahead of circuit ink application unit 51. Drying unit 52 is provided so as to be attached to firing unit 53. Pallet Pm on which the drawing operation has been completed is conveyed by inside conveyance unit 31 to a work position on a left-hand side of firing unit 53. Firing unit 53 takes in the three-dimensional molded object on which the circuit pattern is drawn from pallet Pm using a conveyance hand (not shown in drawings). Drying unit 52 sends out cold air or hot air towards the conductive ink on the three-dimensional molded object to evaporate a part of the solvent to dry the conductive ink.

Next, firing unit 53 heats the conductive ink to further evaporate the solvent, thereby firing the circuit pattern. Subsequently, firing unit 53 returns the three-dimensional molded object on which the circuit pattern is fired to the original position on pallet Pm using the conveyance hand. Alternatively, firing unit 53 may operate so as to take in the whole of pallet Pm on which the three-dimensional molded object is placed to fire the circuit pattern. Additionally, drying unit 52 and firing unit 53 may be configured as separate units.

The influence of the air blown by drying unit 52 is suppressed by shielding member 7, and hence, mounting module 1B is hardly influenced. Further, the influence of heat dissipated during the heating operation performed by firing unit 53 is suppressed by shielding member 7, and hence, mounting module 1B is hardly influenced. As a result, the area requiring the countermeasures against the air so blown and the heat so dissipated is limited to the inside of molding module 1A, whereby not only an increase in cost is suppressed, but also the operational reliability is improved.

3. Inside Configuration of Mounting Module 1B

The inside configuration of mounting module 1B will be described in detail. Second pallet conveyance section 25 is disposed closer to a rear portion inside mounting module 1B while extending in the left-right direction. Second pallet conveyance section 25 has convey-in end 26, which is opened towards molding module 1A, and convey-out end 27, which is opened leftwards of mounting module 1B. Convey-in end 26 of second pallet conveyance section 25 faces convey-out end 24 of first pallet conveyance section 21 with a short distance defined therebetween so as to transfer pallet Pm therebetween.

Receiving pallet Pm at convey-in end 26, second pallet conveyance section 25 conveys pallet Pm into the module and conveys pallet Pm to a predetermined mounting execution position. Second pallet conveyance section 25 can also convey pallet Pm reversely from the mounting execution position to convey-in end 26. Further, second pallet conveyance section 25 conveys pallet Pm on which the three-dimensional molded object, which has been completely molded, is placed down to convey-out end 27, from which pallet Pm is then conveyed out of mounting module 1B.

In FIG. 1, pallet Pm in the mounting execution position is shown by solid lines, and pallet Pm at convey-out end 27 is shown by dashed lines. As with first pallet conveyance section 21, second pallet conveyance section 25 is made up of a conveyor device having a conveyor belt which revolves. First pallet conveyance section 21 and second pallet conveyance section 25 can operate independently so as to convey different pallets Pm.

Mounting work unit group 6 occupies a large part of mounting module 1B. Mounting work unit group 6 mounts an electronic component on the circuit pattern formed on the three-dimensional molded object. Mounting work unit group 6 includes component mounting unit 61, component supply unit 62, paste supply unit 63, and paste curing unit 64. Component mounting unit 61 performs a mounting operation on pallet Pm which is held in the mounting execution position on second pallet conveyance section 25. Component mounting unit 61 includes moving gantry 611, mounting head 612, component camera 614, and a mounting tool station 615.

Moving gantry 611 is a portal moving device that can move in the front-rear direction. Moving gantry 611 passes over second pallet conveyance section 25 and moves generally from a front end to a rear end of mounting module 1B. Mounting head 612 is provided on moving gantry 611 and moves in the left-right direction. Mounting head 612 exchangeably holds one or more component mounting tools 613 on a lower side thereof. Component mounting tool 613 picks up an electronic component from component supply unit 62 and mount the electronic component on the circuit pattern. Multiple component mounting tools 613 may be arranged linearly as shown in FIG. 1 or may be disposed circumferentially. A suction nozzle or a holding-type mounting tool can be exemplified as component mounting tool 613.

Part camera 614 is disposed in the vicinity of a center of mounting module 1B. Part camera 614 images a situation in which component mounting tool 613 of mounting head 612 picks up an electronic component from below and obtains image data. The obtained image data is subjected to image processing, so as not only to determine whether an electronic component is present on mounting head 612 or a proper electronic component is picked up by mounting head 612 but also to determine on the posture of the picked up electronic component. The results of these determinations are reflected to an electronic component mounting operation.

Mounting tool station 615 is disposed on a left-hand side of part camera 614. Mounting tool station 615 temporarily stores multiple types of component mounting tools 613 that can be selectively used in accordance with sizes of electronic components. Mounting tool station 615 further stores temporarily applicators 631 (which will be described in detail later) for applying a paste-like conductive material. Mounting head 612 moves above mounting tool station 615 for automatic exchange of component mounting tools 613 and applicators 631 that mounting head 612 holds.

Component supply unit 62 includes tray-type component supply unit 621 and feeder-type component supply unit 625. Tray-type component supply unit 621 is disposed at a front side of second pallet conveyance section 25. Tray-type component supply unit 621 supplies electronic components using trays 622 that hold multiple electronic components. Multiple trays 622 are placed on component pallet 623. Component pallet 623 is conveyed in from convey-in/out port 624 which is opened in a left surface of mounting module 1B. Alternatively, a pallet conveyance device for automatically conveying component pallet 623 into or out of mounting module 1B may be provided.

Feeder-type component supply unit 625 is disposed at a front leftward portion of mounting module 1B. Feeder-type component supply unit 625 is made up of an arrangement of multiple feeder devices 626. Each feeder device 626 feeds a carrier tape holding multiple electronic components for supply of the electronic components.

Paste supply unit 63 is disposed at a front rightward portion of mounting module 1B that paste supply unit 63 is arranged side by side with feeder-type component supply unit 625. Paste supply unit 63 supplies a paste-like conductive material that electrically and mechanically connects a component mounting position on the circuit pattern with a connecting portion (an electrode or a lead) of an electronic component. Hereinafter, the "paste-like conductive material" will simply be referred to as a "paste". As such a paste, a silver paste or a conductive adhesive that has a higher viscosity than the conductive ink may be used. Alternatively, a molten solder may be used. Paste supply unit 63 is pulled out to the front for provision of the paste, and maintenance and adjustment thereof, or the like.

Paste application work includes or employs a first application method for applying the paste to a component mounting position on the circuit pattern and a second application method for applying the paste to a connecting portion of an electronic component. In the first application method, applicator 631 for applying the paste is held to mounting head 612. That is, mounting head 612 exchangeably holds applicator 631 and component mounting tool 613, or mounting head 612 holds both applicator 631 and component mounting tool 613. On the other hand, in the second application method, applicator 631 is not used. In the case of either the first application method or the second application method being adopted, mounting head 612 plays a dual role for a paste application operation and an electronic component mounting operation.

Pallet Pm on which the three-dimensional molded object, where the circuit pattern has already been formed, is placed is conveyed into the mounting execution position before mounting work unit group 6 starts a mounting operation. In the case that the first paste application method is used, firstly, mounting head 612 moves above paste supply unit 63 while holding applicator 631. Subsequently, mounting head 612 lowers applicator 631 to submerge a lower portion of applicator 631 in the paste so that the paste adheres thereto.

Next, mounting head 612 moves above part camera 614. Part camera 614 images applicator 631 from below to obtain image data. The image data so obtained is subjected to image processing so as to determine whether the adhering state of the paste is good or bad. In the event that the adhering state is not good, mounting head 612 moves above paste supply unit 63 again to retry the submerging operation.

When the adhering state of the paste is good, mounting head 612 moves above the three-dimensional molded object in the mounting execution position. Then, mounting head 612 lowers applicator 631 to apply the paste adhering to the lower portion thereof to the component mounting position on the circuit pattern. This ends the first paste application method.

A transfer pin can be exemplified as applicator 631; however, the transfer pin is not limited thereto. The transfer pin has at a distal end thereof a transfer surface having a shape and a surface area which resemble those where the paste is applied to the circuit pattern. The transfer pin may have only one transfer surface or multiple transfer surfaces which are spaced apart from each other. When the transfer pin is lowered toward paste supply unit 63, the transfer surface is submerged in the paste, whereby the paste adheres thereto. Thereafter, when the transfer pin is lowered toward the circuit pattern, the transfer surface contacts the component mounting position on the circuit pattern, whereby the paste is transferred and applied thereto.

Next, mounting head 612 moves to at least one of tray-type component supply unit 621 and feeder-type component supply unit 625 while holding component mounting tool 613. Then, mounting head 612 lowers component mounting tool 613 to pick up an electronic component from at least one of tray-type component supply unit 621 and feeder-type component supply unit 625. Next, mounting head 612 moves above part camera 614. Part camera 614 images the state in which component mounting tool 613 picks up the electronic component from below and obtains image data. The obtained image data is subjected to image processing so as to determine whether the electronic component is present or the picked up electric component is proper or determine on the pick-up posture of the electronic component.

In the event that the electronic component is determined as failed, mounting head 612 performs a discard process of discarding the electronic component determined as failed. When the electronic component is determined as good, mounting head 612 moves above the three-dimensional molded object in the mounting execution position. Subsequently, mounting head 612 lowers component mounting tool 613 to mount the electronic component on the paste on the circuit pattern. This ends the electronic component mounting operation. Alternatively, mounting head 612 holding multiple component mounting tools 613 can mount electronic components equal to the number of component mounting tools 613 that mounting head 612 holds in one mounting operation. The paste application operation and the electronic component mounting operation are repeated multiple cycles as required.

On the other hand, in the case that the second paste application method is used, mounting head 612 moves to at least one of tray-type component supply unit 621 and feeder-type component supply unit 625 while holding component mounting tool 613. Then, mounting head 612 lowers component mounting tool 613 to pick up an electronic component from at least one of tray-type component supply unit 621 and feeder-type component supply unit 625.

Next, mounting head 612 moves above paste supply unit 63. Then, mounting head 612 lowers component mounting tool 613 to submerge the connecting portion of the picked up electronic component in the paste. As a result, the paste is applied to the connecting portion. In the case that mounting head 612 holds multiple component mounting tools 613, mounting head 612 lowers component mounting tools 613 one by one for application work.

Next, mounting head 612 moves above part camera 614. Part camera 614 images the electronic component picked up by component mounting tool 613 from below to obtain image data. The obtained image data is subjected to image processing so as to determine whether the pick-up posture of the electronic component and the adhering state of the paste are good or bad.

In the event that the pick-up posture of the electronic component and/or the adhering state of the paste is determined as being bad, mounting head 612 retries the relevant operations or operation, or mounting head 612 discards the electronic component which is determined as being bad. When the picked up electronic component is determined as good, mounting head 612 moves above the three-dimensional molded object in the mounting execution position. Subsequently, mounting head 612 lowers component mounting tool 613 to mount the electronic component to which the paste is applied on the circuit pattern. This ends the electronic component mounting operation employing the second paste application method.

Paste curing unit 64 heats the paste to cause the paste to be cured, so as to ensure the mounting state of the electronic component. In the first embodiment, firing unit 53 of molding module 1A doubles as paste curing unit 64 in function. That is, pallet Pm on which the electronic component mounting work is completed is conveyed to firing unit 53 where the paste is cured. Paste curing unit 64 is not limited thereto, and hence, a separate paste curing unit 64 may be provided inside mounting module 1B.

4. Annular Sensor 9 as an Example of Three-Dimensional Molded Object Fr

Figure 2:
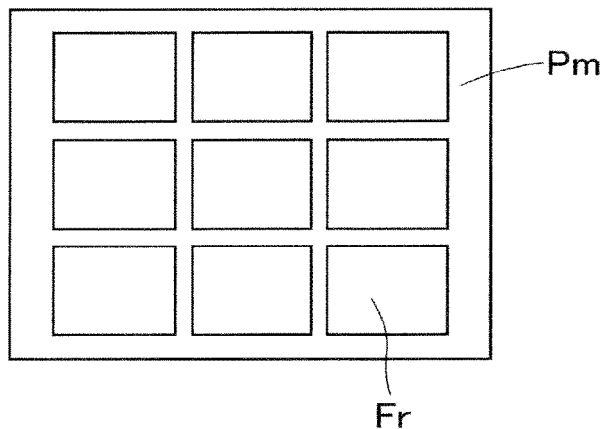
FIG. 2 is a plan view showing an example of an arrangement of three-dimensional molded objects on a pallet.

An example of three-dimensional molded object Fr will be described. One or more three-dimensional molded objects Fr are manufactured on pallet Pm. In an arrangement example shown in FIG. 2, nine three-dimensional molded objects Fr are arranged into a 3×3 configuration on pallet Pm and are manufactured altogether at one time. Nine molded objects Fr may be such that all of them are the same, some of them are the same, or they have different shapes. As a result, three-dimensional molding machine 1 is suitable for batch production of various types of articles or simultaneous production of multiple prototypes which are designed slightly differently.

Figure 3:
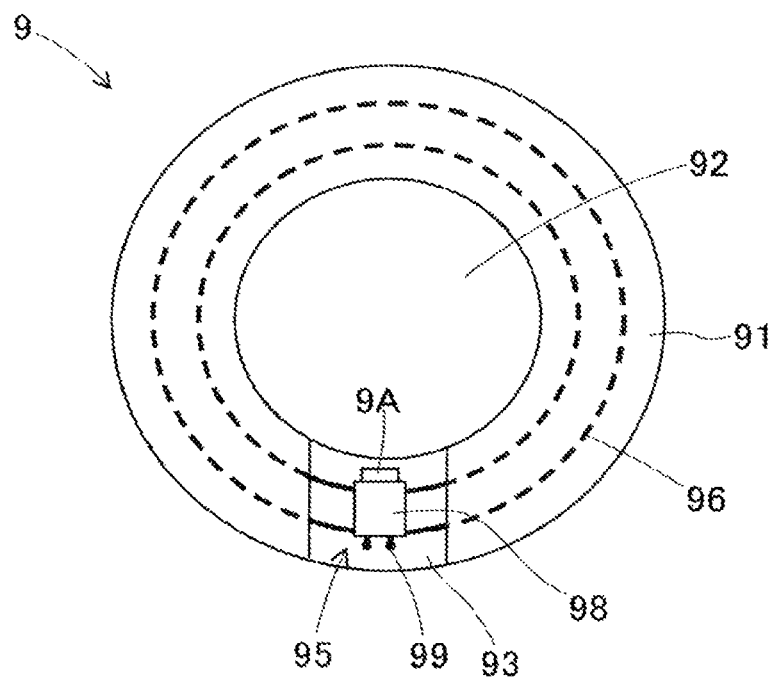
FIG. 3 is a plan view of an annular sensor, which constitutes an example of a three-dimensional molded object.
Figure 4:
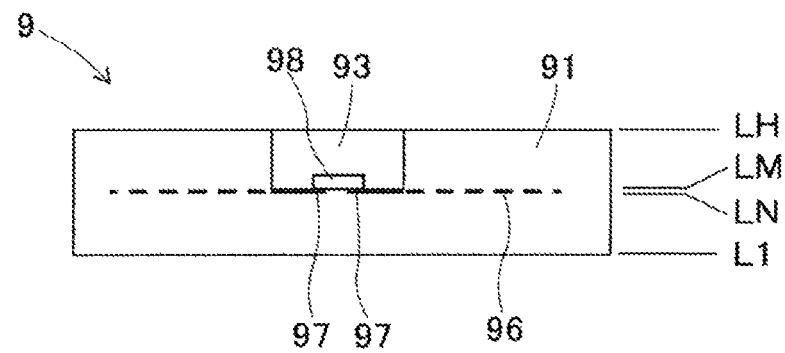
FIG. 4 is a front view of the annular sensor.

As an example of three-dimensional molded object Fr, the configuration of annular sensor 9 configured to detect a magnetic field and a manufacturing method therefor will be described. As shown in FIGS. 3 and 4, annular sensor 9 includes annular base section 91 having hollow portion 92 and electronic circuit 95 provided in base section 91. A cross-section of base section 91 which is orthogonal to a circumferential direction thereof has a rectangular shape; however, the present disclosure is not limited thereto, and hence, the cross-section may have a circular shape. A portion of base section 91 along a circumferential direction thereof is omitted to be reduced in thickness substantially to a thickness resulting from removing an upper half portion thereof and constitutes circuit exposed portion 93.

Electronic circuit 95 includes circuit patterns 96 and two electronic components which are connected to circuit patterns 96. Circuit patterns 96 are embedded in base section 91 at an intermediate height thereof and are exposed at circuit exposed portion 93. Circuit patterns 96 includes two concentric wirings extending along the circumferential direction of base section 91. More precisely, circuit patterns 96 includes two arcuate wirings each having a center angle slightly smaller than 360° and both ends of which are positioned at circuit exposed portion 93. A total of four end portions of circuit patterns 96 constitute component mounting positions 97.

The electronic components includes detection component 98 and battery 9A. Detection component 98 is connected to upper sides of four component mounting positions 97 of circuit patterns 96. Detection component 98 detects a magnitude of a magnetic field that is interlinked with annular circuit patterns 96 by making use of an action of electromagnetic induction. Detection component 98 has a quadrangular plate-like external shape and also has a pair of output terminals 99. As a result of detection component 98 being disposed at circuit exposed portion 93, output signals of output terminals 99 can be obtained from an outside section using output wires.

Battery 9A is mounted in a position situated very closer to detection component 98. Battery 9A is directly connected to a power supply terminal (not shown in drawings) of detection component 98 to supply a power source to detection component 98. As a result of being disposed at circuit exposed portion 93, battery 9A can be exchanged when it is used up. Detection component 98 and battery 9A are supplied from tray 622 of tray-type component supply unit 621.

The control device (not shown in drawings) holds three-dimensional shape data of annular sensor 9. The three-dimensional shape data includes data from first layer data L1 at a lowermost side to an uppermost layer data LH at an uppermost side of annular sensor 9 shown in FIG. 4. Hereinafter, the three-dimensional shape data will be described sequentially from lowermost first layer data L1.

First layer data L1 to (N−1)th layer data are identical to one another and exhibit an annular planar cross-sectional shape without circuit exposed portion 93 of base section 91. Nth layer data LN to (M−1)th layer data are identical to one another and exhibit a C-shaped horizontal cross-sectional shape with circuit exposed portion 93 of base section 91 and the shape of embedded circuit patterns 96. Mth layer data LM exhibits component mounting positions 97 where to mount detection component 98 and battery 9A as well as the C-shaped horizontal cross-sectional shape with circuit exposed portion 93 of base section 91. (M+1)th layer data to uppermost layer data LH are identical to one another and exhibit the C-shaped horizontal cross-sectional shape with circuit exposed portion 93 of base section 91.

Figure 5:
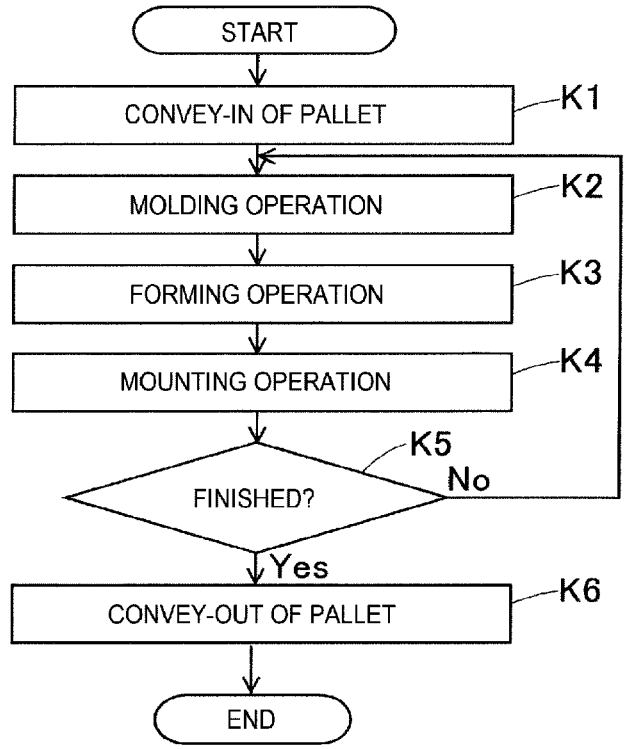
FIG. 5 is a flow chart showing manufacturing steps of manufacturing a three-dimensional molded object using the three-dimensional molding machine.

5. Operation and Function of Three-Dimensional Molding Machine 1 of First Embodiment An operation of three-dimensional molding machine 1 when it manufactures annular sensor 9 will be described by reference to FIG. 5. A manufacturing process diagram shown in FIG. 5 includes six steps from first step K1 to sixth step K6. The steps shown in this manufacturing process diagram are executed based on a control by the control device.

In first step K1, first pallet conveyance section 21 conveys in pallet Pm from convey-in end 23. Hereinafter, detailed operations executed by first pallet conveyance section 21, second pallet conveyance section 25, and inside conveyance unit 31 when they convey pallet Pm will be omitted to avoid complexity. Referring to the layer data sequentially from the lowermost layer data, the control device causes the steps from second step K2 to fifth step K5 to be repeated for each layer data. In the repetition, all of second step K2, third step K3, and fourth step K4 are not necessarily executed. In reality, in many cases, only any one or two steps of those steps are executed.

In second step K2, molding work unit group 4 operates to mold annular sensor 9 in increment of the microscopic height dimension on pallet Pm. Subsequently, in third step K3, forming work unit group 5 operates to form circuit patterns 96 on annular sensor 9, which is being molded. Next, in fourth step K4, mounting work unit group 6 operates to mount detection component 98 and battery 9A on component mounting positions 97 of circuit patterns 96.

Subsequently, in fifth step K5, the control device determines whether the control that refers to uppermost layer data LH has been finished. If the control device determines that the relevant control has not been finished, the control device proceeds upwards by one layer data to the subsequent upper layer data for reference and returns the execution flow of the control to second step K2. If the control device determines that the control that refers to uppermost layer data LH has been executed and that annular sensor 9 has been manufactured completely, the control device proceeds to sixth step K6 in the execution flow of the control. In sixth step K6, second pallet conveyance section 25 conveys out annular sensor 9 together with pallet Pm from convey-out end 27. This ends one manufacturing cycle for manufacturing annular sensor 9.

In the manufacturing steps of annular sensor 9, only second step K2 is repeatedly executed while first layer data L1 to the (N−1)th layer data are being referred to. In addition, second step K2 and third step K3 are repeatedly executed while Nth layer data LN to the (M−1)th layer data are being referred to. Circuit patterns 96 are formed inside base section 91 by repeating the relevant steps. Further, if Mth layer data LM is referred to, second step K2 and fourth step K4 are executed. As a result of fourth step K4 being executed, detection component 98a and battery 9A are mounted in component mounting positions 97 on circuit patterns 96.

In addition, only second step K2 is repeatedly executed while the (M+1)th layer data to uppermost layer data LH are being referred to. As a result, a substantially upper half of the portion of base section 91 where circuit exposed portion 93 is present is molded, whereby circuit patterns 96 are embedded. Annular sensor 9 is completed by following the manufacturing steps as described heretofore.

Here, in the three-dimensional molding machine of the conventional art illustrated in Patent Literature 1, the multiple operations cannot be performed in parallel using multiple pallets Pm simultaneously, and hence, it has been difficult to improve the manufacturing efficiency. In addition, in the conventional art, since it is unclear when pallet Pm arrives in a work unit whose operation is being suspended while it is in operation, there has been caused a problem in that the provision or maintenance of the members cannot be executed.

In contrast to this, in the first embodiment, first pallet conveyance section 21 and second pallet conveyance section 25 operate independently to convey different pallets Pm. Consequently, a work unit of molding module 1A and a work unit of mounting module 1B can perform their operations on two different pallets Pm in parallel. As a result, the manufacturing efficiency of three-dimensional molding machine 1 is enhanced higher than that of the conventional art. With the pallet transfer mechanism disposed near to branching portion 22, the positions of two pallets Pm are exchanged as required to enable the execution of parallel operations.

In addition, molding module 1A and mounting module 1B are configured such that they can individually switch their operations between start and stop thereof. As a result, the provision or maintenance of the members can be executed by stopping one of the modules from operating while the other of the modules is in operation. For example, trays 622 and feeder devices 626 can be exchanged, paste supply unit 63 can be provided with the paste, or paste supply unit 63 can be subjected to maintenance by stopping mounting module 1B from operating while molding module 1A is in operation. In addition, by stopping molding module 1A from operating while mounting module 1B is in operation, inkjet nozzles 513 can be provided with the ink or cleaned in maintenance section 515 of circuit ink application unit 51, ink tank 414 can be provided with the molding ink, or cleaning liquid tank 514 can be provided with the cleaning liquid.

Further, molding module 1A and mounting module 1B are configured such that one of the modules can be detached from the other of the modules to move separately. As a result, the modules can separately be subjected to maintenance so that the modules are separately exchanged or the modules are separately subjected to precise inspection. Additionally, since the modules can be detached from each other to be transported separately, only a simple transportation tool can be used, and the transportation work and installation work can be made simple and easy.

Figure 6:
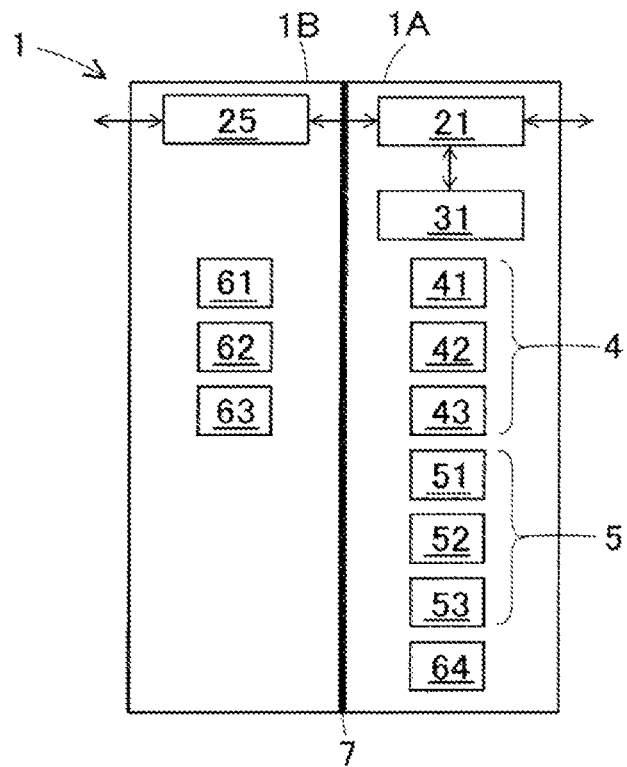
FIG. 6 is a block diagram showing a functional configuration of the three-dimensional molding machine according to the first embodiment.

6. Functional Configuration of Three-Dimensional Molding Machine 1 of First Embodiment and Modified Aspect Thereof When paying attention to a functional configuration of three-dimensional molding machine 1, three-dimensional molding machine 1 is represented by a block diagram in FIG. 6. In FIGS. 6 to 12, bidirectional arrows represent the conveyance of pallet Pm. As shown in FIG. 6, molding module 1A includes nine block elements, that is, first pallet conveyance section 21, inside conveyance unit 31, and seven work units. The seven work units are specifically designated as molding ink application unit 41, planarizing unit 42, curing unit 43, circuit ink application unit 51, drying unit 52, firing unit 53, and paste curing unit 64. In addition, mounting module 1B includes four block elements, that is, second pallet conveyance section 25, component mounting unit 61, component supply unit 62, and paste supply unit 63.

Figure 7:
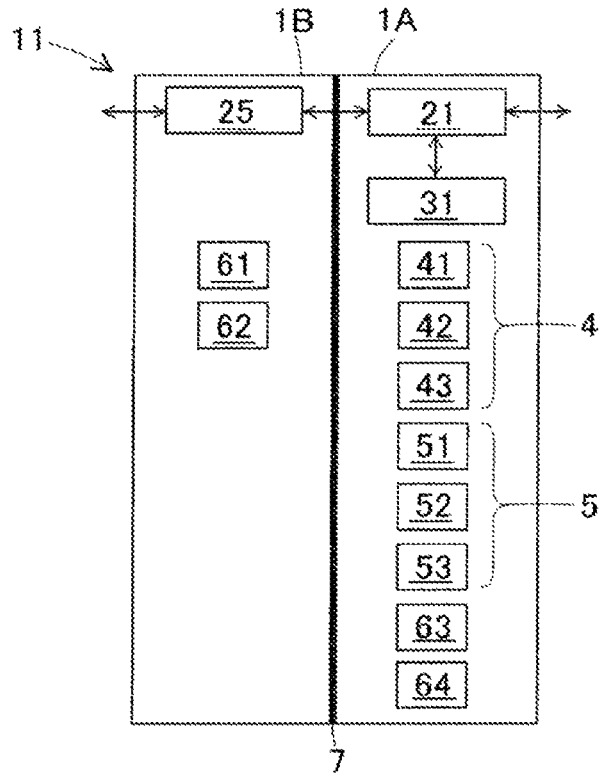
FIG. 7 is a block diagram showing a functional configuration of a modified aspect according to the first embodiment.

The block diagram in FIG. 6 can be modified to a block diagram of three-dimensional molding machine 11 of a modified aspect shown in FIG. 7. In FIG. 7, paste supply unit 63 is moved from mounting module 1B to molding module 1A, and no change is made to the other block elements. In a functional configuration of the block diagram shown in FIG. 7, forming work unit group 5 and paste supply unit 63 are provided inside the same module. As a result, paste supply unit 63 can form a pad (an electrode where to mount an electronic component) on a circuit pattern using the paste immediately after forming work unit group 5 forms the circuit pattern. As a result, since the conveyance operation for conveying pallet Pm is reduced, the manufacturing efficiency is enhanced.

According to three-dimensional molding machine 1 of the first embodiment and its modified aspect, first pallet conveyance section 21 provided in molding module 1A and second pallet conveyance section 25 provided in mounting module 1B share the conveyance operation for conveying pallet Pm. As a result, compared with the driving device of the conventional art that is configured to move pallet Pm freely inside the three-dimensional molding machine, the multiple pallet conveyance sections can be downsized. This realizes the downsizing of three-dimensional molding machine 1. In addition, providing only the two modules without increasing the number of modules meaninglessly and disposing the multiple work units compactly inside the modules contribute to the downsizing of three-dimensional molding machine 1.

Figure 8:
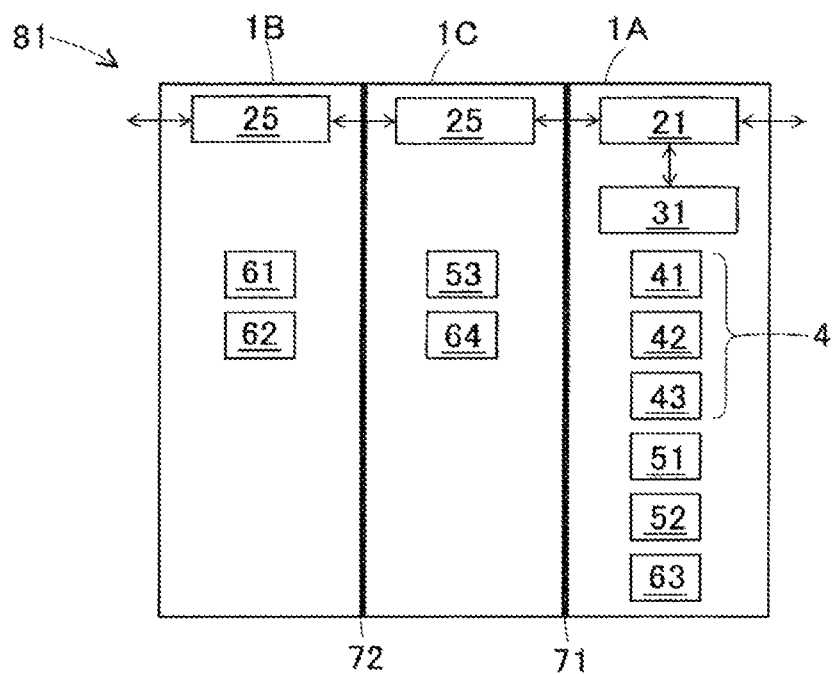
FIG. 8 is a block diagram showing a functional configuration of a three-dimensional molding machine according to a second embodiment.

7. Three-Dimensional Molding Machine 81 of Second Embodiment and Modified Aspect Thereof Referring to block diagrams shown in FIGS. 8 and 9, a second embodiment and its modified aspect will be described. As shown in FIG. 8, three-dimensional molding machine 81 according to the second embodiment includes molding module 1A, heating module 1C, and mounting module 1B which are disposed side by side or adjacent to each other in this order.

Molding module 1A includes first pallet conveyance section 21, inside conveyance unit 31, molding ink application unit 41, planarizing unit 42, curing unit 43, circuit ink application unit 51, drying unit 52, and paste supply unit 63. Heating module 1C includes second pallet conveyance section 25, firing unit 53, and paste curing unit 64. Heating module 1C is a module in which only the work units are provided which are regarded as influencing largely the other work units in a shared operation, and specifically, heating module 1C is a module in which only the work units are provided which dissipate heat when they operate. Mounting module 1B includes second pallet conveyance section 25, component mounting unit 61, and component supply unit 62.

Shielding member 71 disposed between molding module 1A and heating module 1C has a superior heat insulation performance and a superior light cutting-off performance. Shielding member 72 disposed between heating module 1C and mounting module 1B has a superior heat insulation performance. In the second embodiment, the work units which dissipate heat are collected altogether in heating module 1C. As a result, countermeasures against heat dissipation are not required on molding module 1A and mounting module 1B. Further, countermeasures against emitted ultraviolet radiation are not required on heating module 1C and mounting module 1B. As a result, not only an increase in cost is suppressed, but also the operational reliability is improved.

Figure 9:
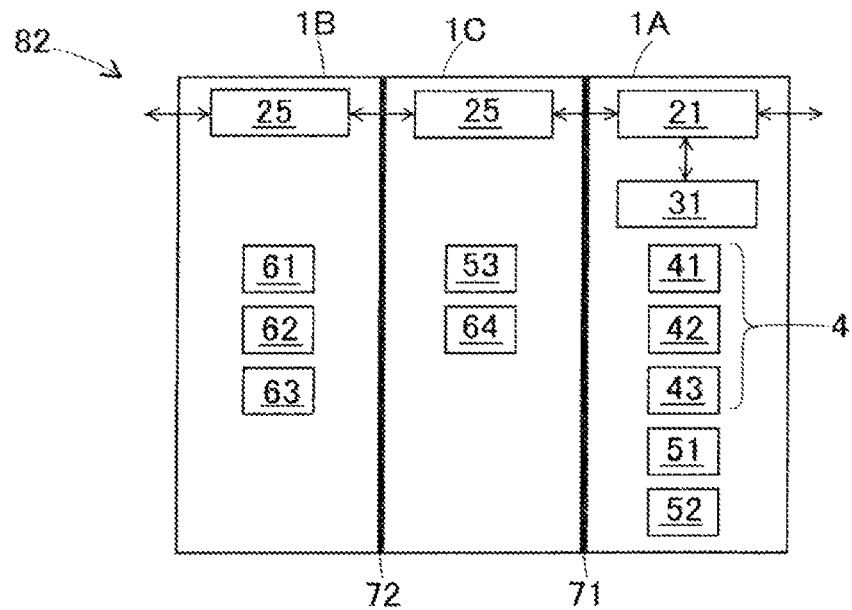
FIG. 9 is a block diagram showing a functional configuration of a modified aspect of the second embodiment.

The block diagram shown in FIG. 8 can be modified to the block diagram of three-dimensional molding machine 82 of a modified aspect shown in FIG. 9. In FIG. 9, paste supply unit 63 is moved from molding module 1A to mounting module 1B, and no change is made to the other block elements and shielding members (71, 72). As described in the modified aspect of the first embodiment, paste supply unit 63 is changeably disposed as required to match a paste supply target. In three-dimensional molding machine 82 according to the modified aspect, as in the case with the second embodiment, not only an increase in cost is suppressed, but also the operational reliability is improved.

Figure 10:
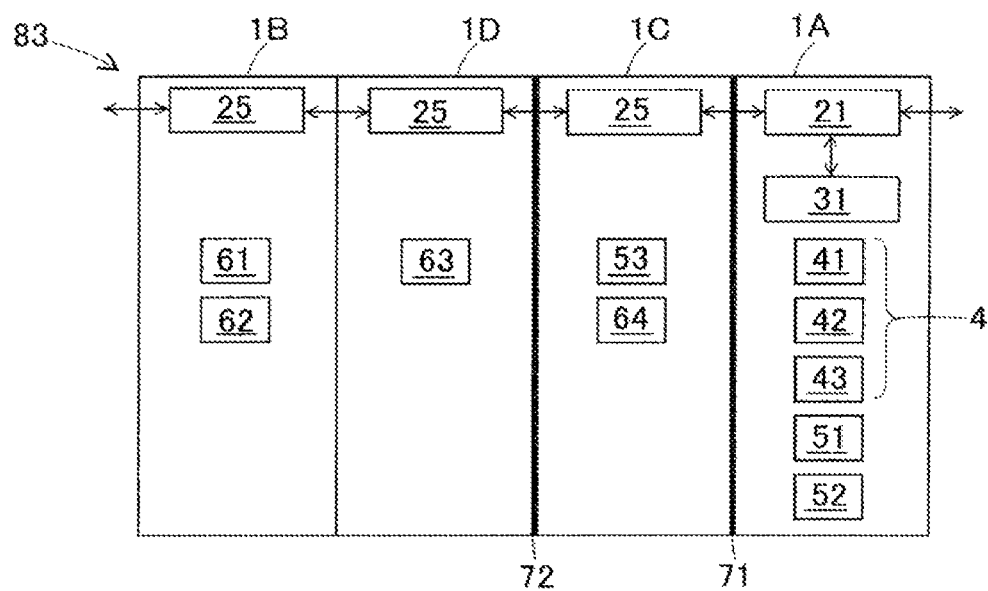
FIG. 10 is a block diagram showing a functional configuration of a three-dimensional molding machine according to a third embodiment.

8. Three-Dimensional Molding Machines (83, 84, 85) According to Third to Fifth Embodiments Referring to block diagrams shown in FIGS. 10 to 12, three-dimensional molding machines (83, 84, 85) according to the third to fifth embodiments will be described. As shown in FIG. 10, three-dimensional molding machine 83 according to the third embodiment includes molding module 1A, heating module 1C, paste supply module 1D, and mounting module 1B which are disposed side by side or adjacent to each other in this order.

Molding module 1A includes first pallet conveyance section 21, inside conveyance unit 31, molding ink application unit 41, planarizing unit 42, curing unit 43, circuit ink application unit 51, and drying unit 52. Inside configurations of heating module 1C and mounting module 1B are the same as those of the second embodiment. Paste supply module 1D includes second pallet conveyance section 25 and paste supply unit 63.

Shielding member 71 disposed between molding module 1A and heating module 1C has a superior heat insulation performance and a superior light cutting-off performance. Shielding member 72 disposed between heating module 1C and paste supply module 1D has a superior heat insulation performance. In the third embodiment, the work units which dissipate heat are collected altogether in heating module 1C. As a result, countermeasures against heat dissipation are not required on the three modules other than heating module 1C. Further, countermeasures against emitted ultraviolet radiation are not required on the three modules other than molding module 1A. As a result, not only an increase in cost is suppressed, but also the operational reliability is improved.

As can be seen by comparing FIG. 10 with FIG. 8, only paste supply unit 63 is separated from molding module 1A of the second embodiment and is then provided as a single work unit in paste supply module 1D of the third embodiment. Here, since paste supply unit 63 performs an operation for supplying the paste to connecting portions of an electronic component and an operation for forming pads on the circuit pattern by use of the paste, the number of times of performing the operations is increased, and the time required for performing the operations becomes long. In the second embodiment, the other work units in molding module 1A cannot perform their own operations during the long time when paste supply unit 63 performs its own operations. That is, paste supply unit 63 constitutes a bottleneck in smoothly following the manufacturing steps.

In contrast to this, in the third embodiment, even if paste supply unit 63 is working on one pallet Pm in paste supply module 1D, the other work units in molding module 1A can work on another pallet Pm in parallel. That is, paste supply unit 63 does not constitute a bottleneck in smoothly following the manufacturing steps. As a result, three-dimensional molding machine 83 according to the third embodiment provides a higher manufacturing efficiency when compared with the second embodiment.

Figure 11:
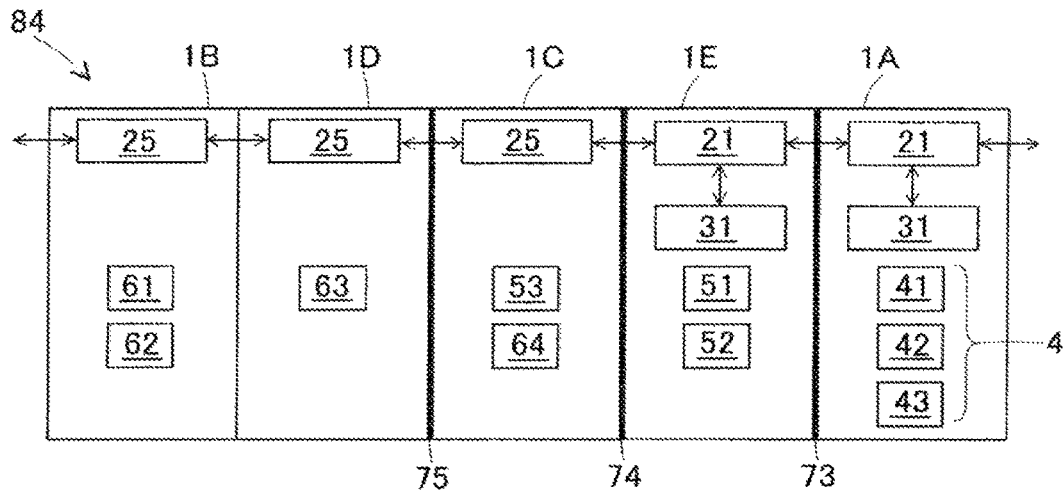
FIG. 11 is a block diagram showing a functional configuration of a three-dimensional molding machine according to a fourth embodiment.

As shown in FIG. 11, three-dimensional molding machine 84 according to the fourth embodiment includes molding module 1A, forming module 1E, heating module 1C, paste supply module 1D, and mounting module 1B which are disposed side by side or adjacent to each other in this order. Molding module 1A includes first pallet conveyance section 21, inside conveyance unit 31, molding ink application unit 41, planarizing unit 42, and curing unit 43. Forming module 1E includes first pallet conveyance section 21, inside conveyance unit 31, circuit ink application unit 51, and drying unit 52. Inside configurations of heating module 1C, paste supply module 1D, and mounting module 1B are the same as those of the third embodiment.

Shielding member 73 disposed between molding module 1A and forming module 1E has a superior light cutting-off performance. Shielding member 74 disposed between forming module 1E and heating module 1C has a superior heat insulation performance. Shielding member 75 disposed between heating module 1C and paste supply module 1D has a superior heat insulation performance. In the fourth embodiment, the work units which dissipate heat are collected altogether in heating module 1C. As a result, countermeasures against heat dissipation are not required on the four modules other than heating module 1C. Further, countermeasures against emitted ultraviolet radiation are not required on the four modules other than molding module 1A. As a result, not only an increase in cost is suppressed, but also the operational reliability is improved.

As can be seen by comparing FIG. 11 with FIG. 10, molding module 1A of the third embodiment is divided, in function, into molding module 1A and forming module 1E of the fourth embodiment. As a result, the work units in molding module 1A and the work units in forming module 1E can individually work on different pallets Pm. In addition, similar to the third embodiment, paste supply module 1D does not constitute a bottleneck in smoothly following the manufacturing steps. As a result, three-dimensional molding machine 84 according to the fourth embodiment has a higher manufacturing efficiency when compared with the third embodiment.

Figure 12:
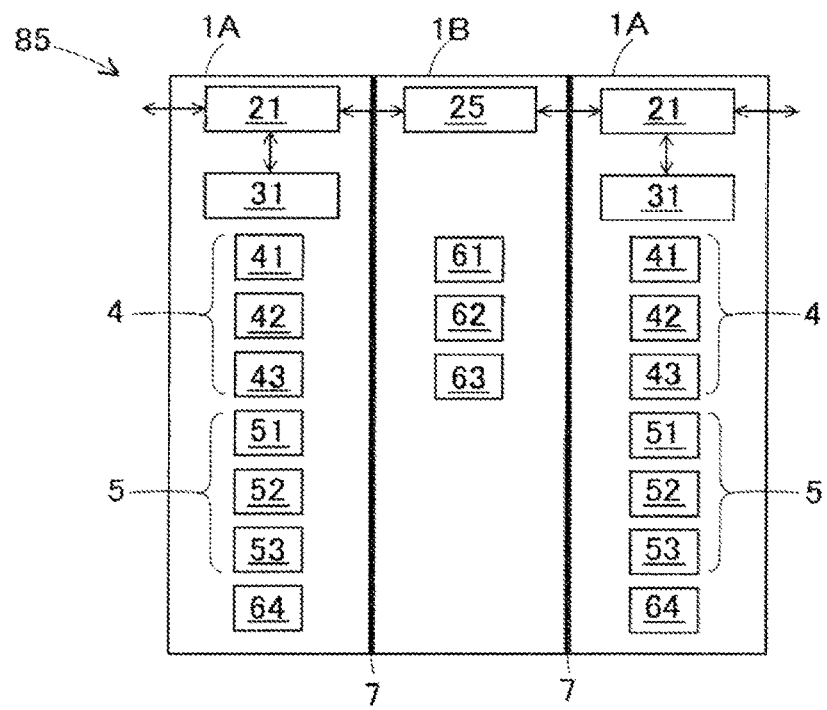
FIG. 12 is a block diagram showing a functional configuration of a three-dimensional molding machine according to a fifth embodiment.

As shown in FIG. 12, three-dimensional molding machine 84 according to the fifth embodiment includes molding module 1A, mounting module 1B, and molding module 1A which are disposed side by side or adjacent to each other in this order. As can be seen by comparing FIG. 12 with FIG. 6, in the fifth embodiment, a second molding module 1A is added to the module configuration of the first embodiment. The arrangement of the modules is laterally symmetrical, so that pallets Pm can be conveyed into molding modules 1A from both left- and right-hand sides and can be conveyed out thereof to both the left- and right-hand sides of the modules.

Here, the required work time in mounting module 1B is equal to or less than a half of the required work time in molding module 1A. As a result, the work units in mounting module 1B can work without any delay on pallets Pm which are alternately conveyed thereinto from molding modules 1A lying on both sides thereof. In other words, three-dimensional molding machine 84 of the fifth embodiment includes two molding modules 1A whose work units provided inside the modules have the long required time for work and one mounting module 1B whose work units provided in the module have the short required time for work. Then, since three-dimensional molding machine 84 of the fifth embodiment has the manufacturing capability which is substantially twice the manufacturing capability of three-dimensional molding machine 1 of the first embodiment without second mounting module 1B, three-dimensional molding machine 84 of the fifth embodiment is advantageous in facility cost.

9. Applications and Modifications of the Embodiments

In the first embodiment, a configuration may be adopted in which molding module 1A does not have inside conveyance unit 31, and molding work unit group 4 and forming work unit group 5 are disposed along first pallet conveyance section 21. A configuration may be adopted in which drying unit 52 is omitted, and firing unit 53 dries and fires the circuit pattern. A configuration may be adopted in which component supply unit 62 of mounting module 1B includes only one of tray-type component supply unit 621 and feeder-type component supply unit 625. Other module inside configurations than those described in the embodiments and other module combinations than those described therein may be adopted.

The molding operations executed by molding work unit group 4 may employ other methods than the method described in the first embodiment which combines the molding ink and the ultraviolet radiation. Further, the forming operations executed by forming work unit group 5 may employ other methods than the method which employs drawing head 512 and inkjet nozzles 513 for drawing. In addition to those described above, the first to fifth embodiments can also be applied or modified in various ways.

REFERENCE SIGNS LIST

1, 11: three-dimensional molding machine, 1A: molding module, 1B: mounting module, 1C: heating module, 1D: paste supply module, 1E: forming module, 21: first pallet conveyance section, 22: branching portion, 25: second pallet conveyance section, 31: inside conveyance unit, 4: molding work unit group, 41: molding ink application unit, 42: planarizing unit, 43: curing unit, 5: forming work unit group, 51: circuit ink application unit, 52: drying unit, 53: firing unit, 6: mounting work unit group, 61: component mounting unit, 62: component supply unit, 63: paste supply unit, 64: paste curing unit, 7, 71-75: shielding member, 81-85: three-dimensional molding machine, 9: annular sensor, 95: electronic circuit, 96: circuit pattern, 98: detection component, 9A: battery, Fr: three-dimensional molded object, Pm: pallet

The invention claimed is:

1. A three-dimensional molding machine for manufacturing a three-dimensional molded object comprising an electronic circuit, the three-dimensional molding machine comprising:
    a molding module that molds the three-dimensional molded object and forms the electronic circuit, the molding module including a first work unit;
    a mounting module that mounts an electronic component on the electronic circuit, the mounting module including a second work unit;
    a first pallet conveyance section in the molding module that conveys a pallet into and out of the molding module, conveys the pallet to the first work unit, and transfers the pallet between the molding module and the mounting module; and
    a second pallet conveyance section in the mounting module that receives the pallet from the first pallet conveyance section, conveys the pallet to the second work unit, and conveys the pallet out of the mounting module.

2. The three-dimensional molding machine according to claim 1, wherein
    the first work unit shares a molding operation for molding the three-dimensional molded object; and
    the second work unit shares a mounting operation for mounting the electronic component on the electronic circuit.

3. The three-dimensional molding machine according to claim 2, wherein
    the molding module includes a third work unit that shares a forming operation for forming the electronic circuit.

4. The three-dimensional molding machine according to claim 3, wherein
    the molding module includes an inside conveyance unit that conveys the pallet between the first pallet conveyance section, the first work unit, and the third work unit.

5. The three-dimensional molding machine according to claim 1, wherein
    the first pallet conveyance section and the second pallet conveyance section operate independently to convey different pallets, and
    the molding module and the mounting module execute operations on the different pallets.

6. The three-dimensional molding machine according to claim 1, comprising:
    the molding module and the mounting module individually switch an operation thereof between start and stop.

7. The three-dimensional molding machine according to claim 1, comprising:
    the molding module and the mounting module are detachable from each other to be moved to allow at least one of exchange or maintenance.

8. The three-dimensional molding machine according to claim 1, further comprising:
    a shielding member disposed between the molding module and the mounting module, the shielding member suppresses an influence imposed by a work unit inside one of the molding module and the mounting module on the other of the molding module and the mounting module.

9. The three-dimensional molding machine according to claim 8, wherein
the shielding member suppresses at least one of influences of heat dissipation, air blowing, or ultraviolet radiation emission.

\* \* \* \* \*